United States Patent [19]

Suyama et al.

[11] Patent Number: 5,022,036
[45] Date of Patent: Jun. 4, 1991

[54] SEMICONDUCTOR LASER DEVICE

[75] Inventors: Takahiro Suyama, Tenri; Masafumi Kondo, Nara; Kazuaki Sasaki, Yao; Masahiro Hosoda; Kosei Takahashi, both of Nara; Toshiro Hayakawa, Yokohama, all of Japan

[73] Assignee: Sharp Kabushiki Kaisha, Osaka, Japan

[21] Appl. No.: 456,673

[22] Filed: Dec. 27, 1989

[30] Foreign Application Priority Data

Dec. 29, 1988 [JP] Japan .................................. 63-334122
Dec. 29, 1988 [JP] Japan .................................. 63-334124
Dec. 29, 1988 [JP] Japan .................................. 63-334128

[51] Int. Cl.⁵ ............................................. H01S 3/19
[52] U.S. Cl. ..................................... 372/45; 372/46
[58] Field of Search ............................. 372/43–45, 372/46

[56] References Cited

U.S. PATENT DOCUMENTS

| | | | |
|---|---|---|---|
| 4,694,460 | 9/1987 | Hayakawa | 372/45 |
| 4,783,788 | 11/1988 | Gordon | 372/45 |
| 4,899,349 | 2/1990 | Hayakawa et al. | 372/44 |

FOREIGN PATENT DOCUMENTS

| | | |
|---|---|---|
| 273726 | 7/1988 | European Pat. Off. |
| 3612695 | 10/1987 | Fed. Rep. of Germany |
| 61-174685 | 8/1986 | Japan |
| 62-20392 | 1/1987 | Japan |

OTHER PUBLICATIONS

Suyama et al., Japanese Laid-Open Patent Publication No. 2-178989, laid on Jul. 11, 1990, with English abstract.
Suyama et al., Japanese Laid-Open Patent Publication No. 2-177584, laid on Jul. 10, 1990, with English abstract.
Sasaki et al., Japanese Laid-Open Patent Publication No. 2-178984, laid on Jul. 11, 1990, with English abstract.
Suzuki et al., Electronics Letters 20(9): 383-384 (1984); Apr., "Fabrication of GaAlAs Window-Stripe Multi--Quantum well Heterostructure Lasers Utilising Zn Diffusion-Induced Alloying".
Kawanishi et al., Japanese Journal of Applied Physics 27(7):L1310-1312 (1988), Jul., "High Power CW Operation in V-Channel Substrate Inner-Stripe Laser with 'Torch' Shaped Waveguide".
Scifres et al., Xerox Disclosure Journal 10(6)383-387 (1985), Nov./Dec., "Semiconductor Quantum Well Window Lasers".

*Primary Examiner*—Georgia Epps
*Attorney, Agent, or Firm*—Irell & Manella

[57] ABSTRACT

A semiconductor laser device is disclosed which comprises a semiconductor substrate and a multi-layered crystal structure disposed on the substrate, the multi-layered crystal structure containing a first cladding layer, a quantum-well active layer for laser oscillation, and a second cladding layer with a striped ridge portion for current injection, wherein the difference in the effective refractive index between the region underneath the striped ridge portion and the adjacent regions thereto is greater in the vicinity of at least one of the facets than inside of the facets.

4 Claims, 8 Drawing Sheets

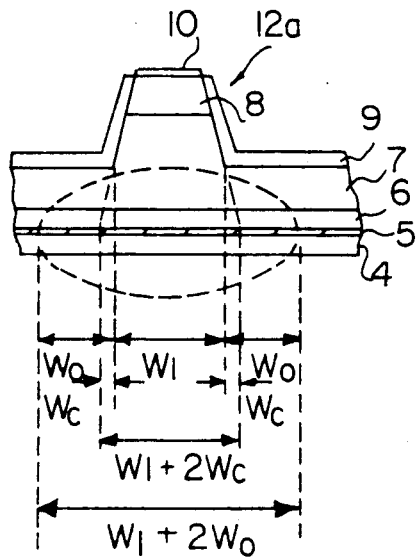 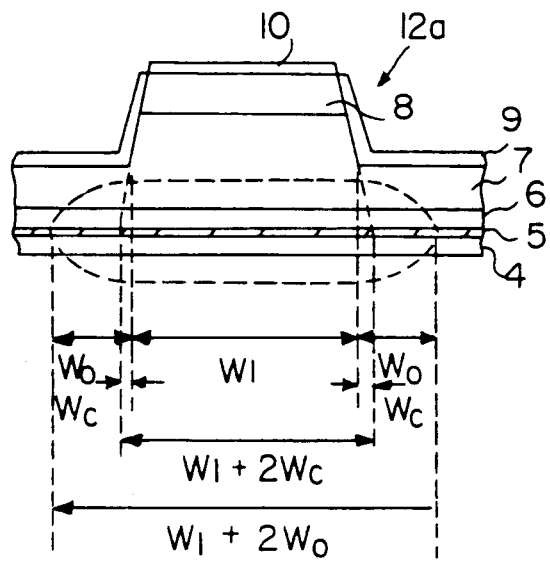
FIG. 2a  FIG. 2b
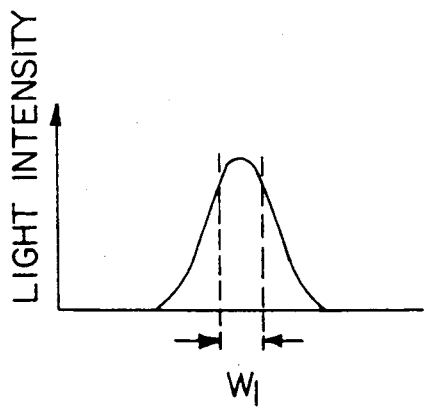 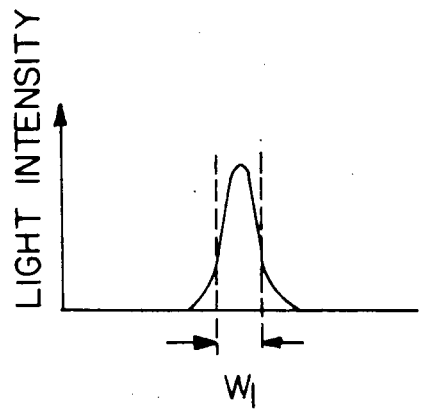
FIG. 3a  FIG. 3b

SEMICONDUCTOR LASER DEVICE

BACKGROUND OF THE INVENTION

1. Field of the invention

This invention relates to a semiconductor laser device with excellent low noise characteristics.

2. Description of the prior art

In general, semiconductor laser devices used in video disc players and other apparatuses are required to have excellent low noise characteristics. To meet this need for low noise characteristics, semiconductor laser devices employing the self-sustained pulsation phenomenon are often used. If the self-sustained pulsation phenomenon is employed, the oscillation spectrum has multiple longitudinal modes. Moreover, the spectral band width of each longitudinal mode becomes larger, thereby attaining low noise characteristics.

FIG. 11 shows a conventional semiconductor laser device. In this semiconductor laser device, the active layer has a quantum-well structure to decrease the oscillation threshold current. The semiconductor laser device can be produced as follows. On the plane of an n-GaAs substrate 91, an n-GaAs buffer layer 92, an n-AlGaAs cladding layer 93, an AlGaAs graded-index light guiding layer 94, an AlGaAs quantum-well active layer 95, an AlGaAs graded-index light guiding layer 96, a p-AlGaAs cladding layer 97, and a p-GaAs cap layer 98 are successively grown by molecular beam epitaxy. The Al mole fractions in the graded-index light guiding layers 94 and 96 are allowed to decrease gradually toward the active layer.

Next, the p-AlGaAs cladding layer 97 and the p-GaAs cap layer 98 are subjected to a photolithographic treatment to form a striped ridge portion 82 (width $W_1 = 3$ μm) by a reactive ion beam etching technique. Then, an $SiN_x$ insulating layer 99 formed on the entire surface of the p-AlGaAs cladding layer 97 and the side faces of the p-GaAs cap layer 98, after which a p-type electrode 80 and an n-type electrode 81 are formed on the upper face of the p-GaAs cap layer 98 and the back face of the n-GaAs substrate 91, respectively, resulting in a semiconductor laser device.

In this semiconductor laser device, because the sum d of the thicknesses of the p-AlGaAs cladding layer 97 and the AlGaAs graded-index light guiding layer 96 on both sides of the striped ridge portion 82 is set at a large value, the difference in the effective refractive index between the region underneath the striped ridge portion 82 and the adjacent regions thereto becomes small. Furthermore, the oscillation threshold current can be reduced, because the active layer has a quantum-well structure. However, because the index guiding mechanism is weak in this semiconductor laser device, the characteristics of the laser beam obtained are similar to those of the laser beam emitted by a gain guiding mechanism. Therefore, the degree of astigmatism thereof is extremely high, being greater than 30 μm.

SUMMARY OF THE INVENTION

A semiconductor laser device of this invention, which overcomes the above-discussed and numerous other disadvantages and deficiencies of the prior art, comprises a semiconductor substrate and a multi-layered crystal structure disposed on the substrate, the multi-layered crystal structure containing a first cladding layer, a quantum-well active layer for laser oscillation, and a second cladding layer with a striped ridge portion for current injection, wherein the difference in the effective refractive index between the region underneath the striped ridge portion and the adjacent regions thereto is greater in the vicinity of at least one of the facets than inside of the facets.

In a preferred embodiment, the thickness of the second cladding layer except for the striped ridge portion is smaller in the vicinity of at least one of the facets than inside of the facets.

In a more preferred embodiment, the width of the striped ridge portion is greater in the vicinity of at least one of the facets than inside of the facets.

In a more preferred embodiment, the abovementioned semiconductor laser device further comprises a cap layer formed on the striped ridge portion, the thickness of the cap layer being smaller in the vicinity of at least one of the facets than inside of the facets, with the proviso that the distance between the active layer and the cap layer is constant over the entire area in the cavity direction.

Thus, the invention described herein makes possible the objectives of (1) providing a semiconductor device with low noise characteristics, low threshold current, and a small degree of astigmatism; and (2) providing a semiconductor device which can readily be produced, although it has low noise characteristics, low threshold current, and a small degree of astigmatism.

BRIEF DESCRIPTION OF THE DRAWINGS

This invention may be better understood and its numerous objects and advantages will become apparent to those skilled in the art by reference to the accompanying drawings as follows:

FIGS. 1b and 1c are sectional views showing the sectional configurations in the main lasing area and the mode stabilizing area, respectively, of the semiconductor laser device of FIG. 1a.

FIG. 1d is a top plan view showing the area where the resist mask is formed in the production of the semiconductor laser device of FIG. 1a.

FIGS. 2a and 2b are fragmentary sectional views showing the relationship between the current injection width and the light-emitting spot size in the semiconductor laser device of FIG. 1a.

FIGS. 3a and 3b are schematic diagrams showing the light intensity distributions in the main lasing area and the mode stabilizing area, respectively, of the semiconductor laser device of FIG. 1a.

FIGS. 4b and 4d are sectional views showing the sectional configurations in the main lasing area and the mode stabilizing area, respectively, of the semiconductor laser device of FIG. 4a.

FIGS. 4c and 4e are schematic diagrams showing the light intensity distributions in the main lasing area and the mode stabilizing area, respectively, of the semiconductor laser device of FIG. 4a.

DESCRIPTION OF THE PREFERRED EMBODIMENTS

Example 1

Figure 1A:
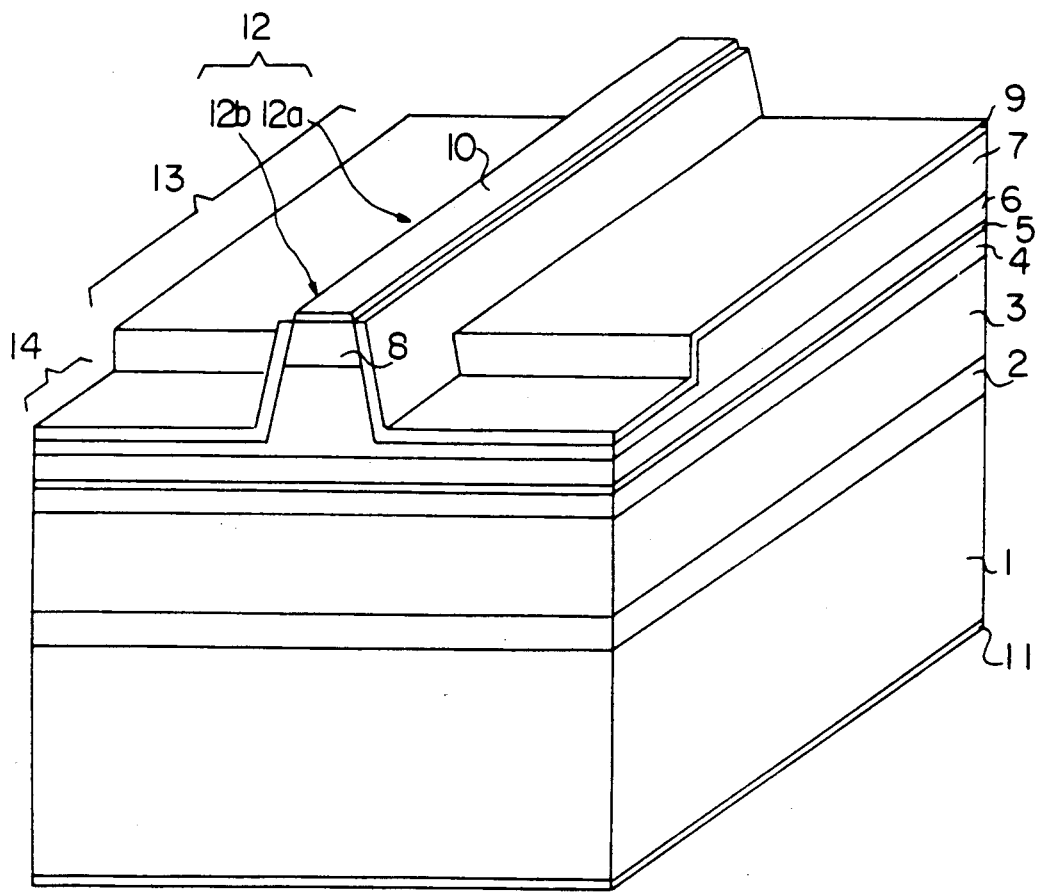
FIG. 1a is a perspective view showing a semiconductor laser device of this invention.
Figure 1B:
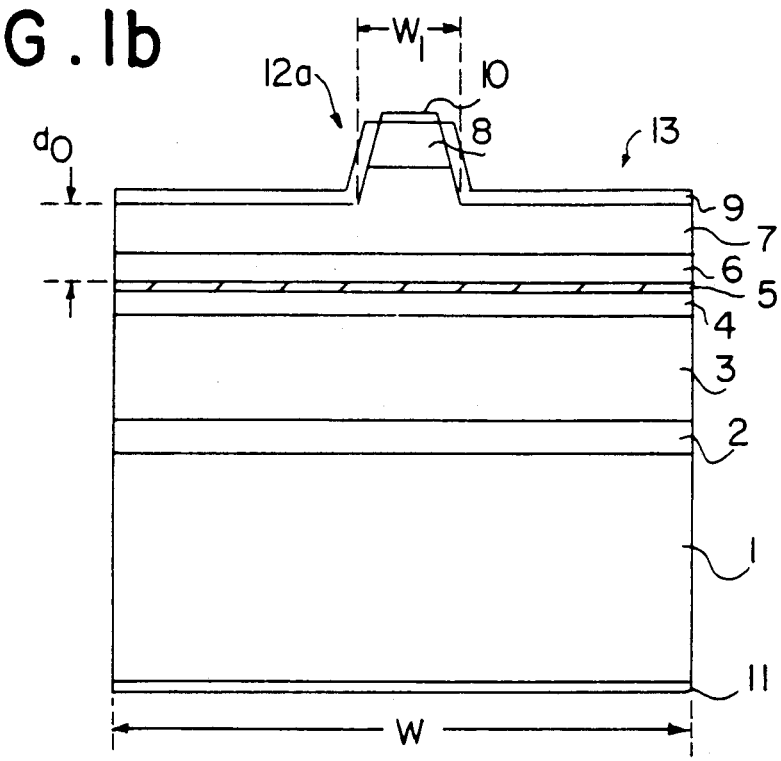
Figure 1C:
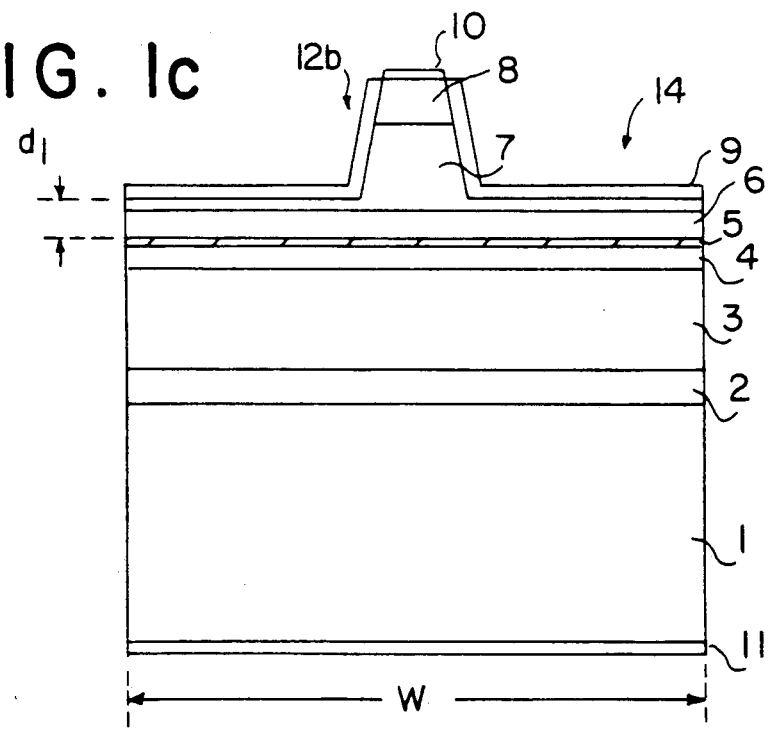

FIG. 1a shows a semiconductor laser device of this example. FIG. 1b shows a sectional configuration of the device in the main lasing area 13 inside of the facet. FIG. 1c shows a sectional configuration of the device in the mode stabilizing area 14 near the facet. This semiconductor laser device was produced as follows. On the plane of an n-GaAs substrate 1, an n-GaAs buffer layer 2 (0.5 μm thick), an n-$Al_{0.5}Ga_{0.5}As$ first cladding layer 3 (1.2 μm thick), an $Al_xGa_{1-x}As$ graded-index light guiding layer 4 (0.15 μm thick; x=0.5→0.3), an $Al_{0.1}Ga_{0.8}As$ single quantum-well active layer 5 (0.01 μm thick), an $Al_xGa_{1-x}As$ graded-index light guiding layer 6 (0.15 μm thick; x=0.3→0.5), a p-$Al_{0.5}Ga_{0.5}As$ second cladding layer 7 (1.2 μm thick), and a p-GaAs cap layer 8 (0.5 μm thick) were successively grown by molecular beam epitaxy. The Al mole fractions in the graded-index light guiding layers 4 and 6 were allowed to decrease gradually from 0.5 to 0.3 toward the active layer 5.

Next, resist mask strips with a width $\omega_1$ were formed in parallel with each other on the p-GaAs cap layer 8. The pitch between the strips corresponds to the width W of the semiconductor laser device to be produced. Thereafter, the second cladding layer 7 and the cap layer 8 in all areas except for the strip areas with a width $\omega_1$ were etched to form a striped ridge portion 12 by a reactive ion beam etching technique. This etching technique brought the combined thickness $d_O$ of the light guiding layer 6 and the second cladding layer 7 down to 0.55 μm. The striped ridge portion 12 was formed so that the width $W_1$ thereof on the side closest to the active layer 5 was 2.5 μm. The resist mask strips were then removed and a new resist mask was formed o the ridge portion 12 and the surface of the second cladding layer 7 in the area corresponding to the main lasing area 13. Assuming the cavity length is L and the depth in the cavity direction of the mode stabilizing area with the sectional configuration shown in FIG. 1c is r, the new resist mask was formed in the area of length 2L−2r between the striped ridge portions 12 as indicated by the crosshatching in FIG. 1d. The pitch of the areas of length 2L−2r is 2L. In this example, r was 30 μm and L was 250 μm. Next, a reactive ion beam etching technique was used to etch the second cladding layer 7 so that the combined thickness $d_1$ of these layers in the area where the foregoing resist mask had not been formed became 0.25 μm, resulting in the striped ridge portions 12a and 12b.

After the formation of the ridge portions 12a and 12b, the resist mask was removed. Then, the $SiN_x$ insulating film 9 was formed over the entire surface of the second cladding layer 7 and the cap layer 8 as an insulating layer by plasma chemical vapor deposition (CVD). The $SiN_x$ insulating film 9 on the upper face of the ridge portions 12a and 12b was selectively removed by photolithography. Thereafter, a p-sided electrode 10 and an n-sided electrode 11 were formed on the upper face of the cap layer 8 and the back face of the substrate 1, respectively. Finally, the wafer was divided into chips by a cleavage method to yield the semiconductor laser devices.

The semiconductor laser device of this example has a quantum well structure in the active layer 5 and it also has a graded-index separate confinement heterostructure (GRIN-SCH), in which the graded-index light guiding layers 4 and 6 are formed on either side of the active layer 5, so that the oscillation threshold current is reduced.

In the semiconductor laser device of this example, self-sustained pulsation in the main lasing area 13 occurs as follows. The current is injected to the active layer 5 from the ridge portion 12a through the second cladding layer 7 and the light guiding layer 6. Since the combined thickness of the light guiding layer 6 and the second cladding layer 7 is approximately 0.55 μm, the current spreads out relatively little, so that the width of current injection in the active layer 5 (i.e., the width which generates gain) is nearly equal to the width $W_1$ of the current injection path of the ridge portion 12a (i.e., the width where the current exits on the side of the ridge portion 12a closest to the active layer 5). If the active layer 5 were formed with the same thickness as that in a conventional double heterostructure semiconductor laser device, a reduction in the oscillation threshold current as that obtained with the quantum-well structure could not be achieved. Moreover, because the combined thickness of the light guiding layer 6 and the second cladding layer 7 except for the ridge portion 12a is as thick as about 0.55 μm, the difference Δn in the effective refractive index between the region underneath the ridge portion 12a and the adjacent regions thereto is extremely small (approximately $1\times10^{-3}$ in this example). Therefore, when the carrier is injected into the active layer 5 for laser oscillation, the difference in the effective refractive index between the region underneath the ridge portion 12a and the adjacent regions thereto is substantially eliminated by the refractive index reduction effect due to the carrier. Therefore, the confinement of light to the region underneath the ridge portion 12a is extremely small. The refractive index reduction due to this carrier injection is determined by the carrier density required for laser oscillation. The carrier density required for laser oscillation varies depending on the structure near the active layer, cavity length, reflectivity of the facets, and other factors. It was confirmed that if the difference in the effective refractive index between the region underneath the ridge portion 12a and the adjacent regions thereto are $1\times10^{-4}$ to $5\times10^{-3}$, the difference in the effective refractive index therebetween becomes extremely small during laser operation, resulting in a self-sustained pulsation. This can also be understood from the fact that the reduction in the refractive index due to carrier injection in a conventional semiconductor laser device is about 1 to $2\times10^{-3}$ (H. C. Casey, Jr., M. B. Panish, *Heterostructure Lasers*, p. 31). Since the index guiding mechanism is weak and the light absorption in the active layer 5 is small, the light distribution width becomes greater than the width where the current is injected in the active layer. In a conventional semiconductor laser device with the sectional configuration shown in FIG. 1b over the entire length of the cavity, it was confirmed that the light distribution width was 5 to 6 μm, approximately twice the width of the striped ridge portion 12a. In such a case where the gain area width and the light distribution width greatly differ, fluctuations in the carrier density and light distribution occur due to the interaction of the carrier and light in the oscillation area, resulting in a self-sustained pulsation.

When the width of current injection is greater than the light distribution width, the index guiding mechanism becomes stronger due to self-focusing, so that the light distribution width does not increase. Therefore, the current injection width must be narrower than the light distribution width.

The current injection width is greatly dependent on the carrier density n of the second cladding layer 7 and the combined thickness $d_O$ of the light guiding layer 6 and the second cladding layer 7 except for the ridge portion 12a. That is, current spread becomes smaller as both the carrier density n and the combined thickness $d_O$ become smaller.

The light distribution spread is highly dependent on the combined thickness $d_O$ of the light guiding layer 6 and the second cladding layer 7 except for the ridge portion 12a. As the thickness $d_O$ becomes larger, the ratio of the combined thickness of the light guiding layer 6 and the second cladding layer 7 including the ridge portion 12a to the combined thickness $d_O$ of the light guiding layer 6 and the second cladding layer 7 except for the ridge portion 12a becomes smaller, resulting in a smaller effective refractive index difference Δn between the region underneath the ridge portion 12a and the adjacent regions thereto. When the effective refractive index difference Δn becomes small to a certain degree, the index guiding mechanism becomes markedly weak and the light distribution spread instantly becomes large.

Therefore, in order to obtain a small current injection width, the thickness $d_O$ should be small, and in order to obtain a large light distribution spread, the thickness $d_O$ should be large. This means that there is a range for the optimum thickness $d_O$ to satisfy both of these requirements. It was confirmed that a desirable thickness $d_O$ will be 0.2 to 0.8 μm. It was also confirmed that self-sustained pulsation can be attained if the effective refractive index difference Δn is within the range of $1\times10^{-4}$ to $5\times10^{-3}$. In this example, it is desired that the carrier density n of the second cladding layer 7 is equal to or less than $1\times10^{18}$cm$^{-3}$.

The width $W_1$ of the exit for current from the ridge portion 12a (i.e., current injection path) affects the width of current injection in the active layer, and it is an important factor in achieving self-sustained pulsation. As shown in FIGS. 2a and 2b, the width in which the current is actually injected in the active layer 5 is represented by $W_1+2W_c$. $W_c$ is the width in which the current spreads on one side while passing through the light guiding layer 6 an second cladding layer 7 with the combined thickness $d_O$. In the same way, the width of light distribution is represented by $W_1+2W_o$ is the width in which the light distribution spreads on one side out from the width $W_1$ of the current injection path. As can be seen from a comparison of FIGS. 2a and 2b, even though the width $W_1$ changes, the widths $W_c$ and $W_o$ hardly change at all, so that the ratio of the light distribution width to the current injection width $(W_1+2W_o)/(W_1+2W_c)$ becomes larger as $W_1$ becomes smaller, resulting in an increase in the effect of the interaction between the carrier and the light. Therefore, the smaller the width $W_1$ of the current injection path, the more advantageous it is to achieve self-sustained pulsation. In other words, it is desirable to make the current injection width $W_1$ of the ridge portion 12a small to the extent it will not bring about undue adverse effects on other characteristics of the semiconductor laser device. In the semiconductor laser device of this example, it was confirmed that a desirable $W_1$ value will be 0.5 to 4 μm.

In this example, the index guiding mechanism of the main lasing area 13 shown in FIG. 1b is extremely weak. In a conventional semiconductor laser device with the sectional configuration shown structure in FIG. 1b over the entire length of the cavity, a problem of astigmatism is encountered that is not seen in a semiconductor laser device with an index guiding strip structure. In order to make the degree of astigmatism smaller in this example, the combined thickness $d_1$ of the light guiding layer 6 and the second cladding layer 7 except for the ridge portion 12a is decreased to approximately 0.25 μm within approximately 30 μm deep from the facet as shown in FIG. 1c. As explained above, the injection carrier has a reducing effect on the refractive index during laser operation, but since the thickness of the second cladding layer 7 except for the striped ridge portion 12b is small in the vicinity of the facet, a large difference in the effective refractive index can be maintained. The effective refractive index difference required to avoid the refractive index reducing effect differs with the semiconductor laser device structure, but it is equal to or greater than $1\times10^{-3}$ and typically $5\times10^{-3}$ to $1\times10^{-2}$. By using such a configuration, the index guiding mechanism can be strengthened only in the mode stabilizing area 14 near the facet and the degree of astigmatism can be made smaller.

Example 2

Other problems may occur in the configuration of the above example, even though the degree of astigmatism can be made smaller. FIGS. 3a and 3b show the light intensity distributions in the main lasing area 13 and the mode stabilizing area 14, respectively. Due to the large thickness of the second cladding layer 7 in the main lasing area 13, the light distribution spread becomes larger, as shown in FIG. 3a, increasing to a width of ob 5 to 6 μm as stated earlier. In the mode stabilizing area 14, however, the light distribution spread becomes smaller, 2.5 to 3 μm, as shown in FIG. 3b, due to the small thickness of the second cladding layer 7. Since the mode of the waveguided light differs in these two areas like this, loss occurs at the interface between the two areas due to the mode difference. This loss causes the oscillation threshold current to increase. The oscillation threshold current of the semiconductor laser device shown in FIGS. 1a to 1c is 10 to 20 mA greater than the oscillation threshold current of a conventional semiconductor laser device with the sectional configuration shown in FIG. 1b over the entire area in the cavity direction. This increase in the oscillation threshold current becomes larger when the active layer has a quantum-well structure accompanied by a graded-index separate confinement heterostructure (GRIN-SCH) or SCH.

Figure 4A:
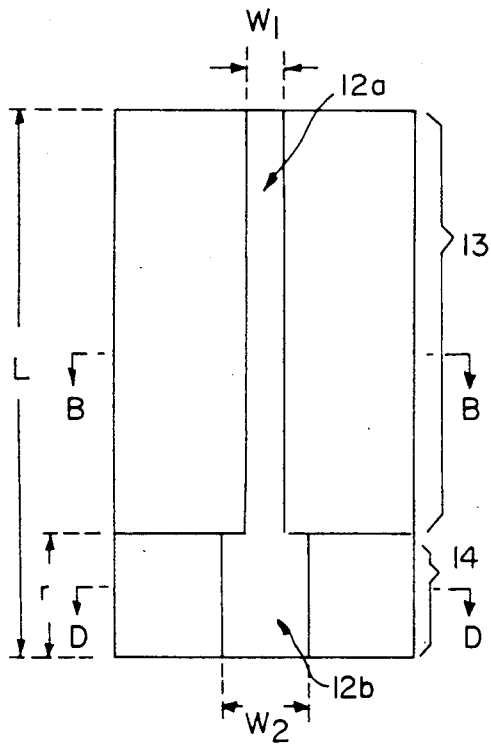
FIG. 4a is a top plan view showing another semiconductor laser device of this invention.
Figure 4B:
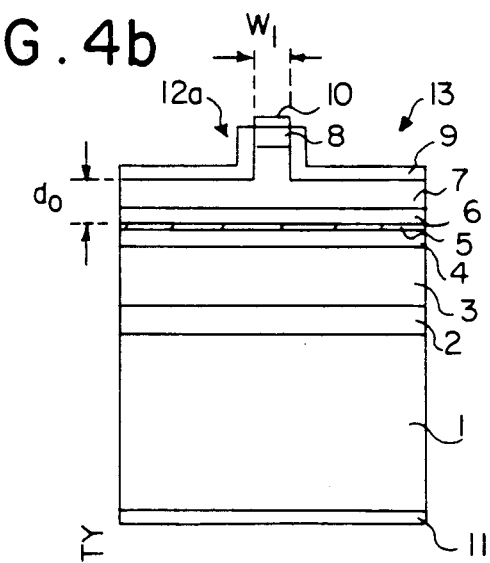
Figure 4C:
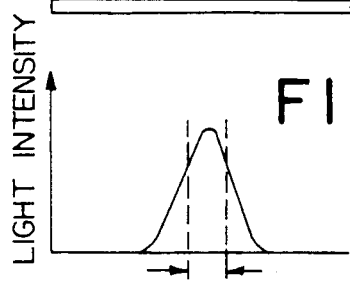
Figure 4D:
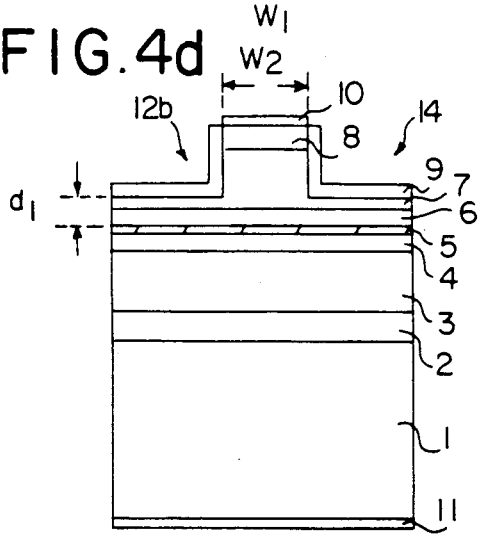

FIG. 4a is a top plan view showing another semiconductor laser device of this invention. FIGS. 4b and 4d are sectional views showing the main lasing area 13 and the mode stabilizing area 14, taken along lines B-B and D-D of FIG. 4a, respectively. This semiconductor laser device was produced as follows. On the plane of an n-GaAs substrate 1, an n-GaAs buffer layer 2 (about 1 $\mu$m thick), an n-AlGaAs first cladding layer 3 (1.2 $\mu$m thick), an AlGaAs graded-index light guiding layer 4 (0.2 $\mu$m thick), an AlGaAs single quantum-well active layer 5 (70 Å thick), an AlGaAs graded-index light guiding layer 6 (0.2 $\mu$m thick), a p-AlGaAs second cladding layer 7 (1.2 $\mu$m thick), and a p-GaAs cap layer 8 (0.6 $\mu$m thick) were successively grown by molecular beam epitaxy. The Al mole fractions of the graded-index light guiding layers 4 and 6 were allowed to decrease gradually toward the active layer 5. Next, striped ridge portions 12a and 12b which serves as the current injection path were formed by photolithography. In order to form the ridge portions 12a and 12b shaped as shown in FIGS. 4b and 4d, respectively, a photoresist mask was formed in two alternating areas of length $2L-2r$ and width $W_1$ and length $2r$ and width $W_2$ with pitch 2L so that $1.5W_2 \leq W_2 \leq 4W_1$. Here, L is the cavity length of the semiconductor laser device and r is the depth in the cavity direction of the mode stabilizing area 14. In this example, the width $W_1$ was set at a value of approximately 2.5 $\mu$m and the width $W_2$ at a value of approximately 6 $\mu$m. The second cladding layer 7 and the cap layer 8 in all areas except for the alternating strip areas mentioned above was then etched to form the ridge portions 12a and 12b by a reactive ion beam etching technique. This etching brought the combined thickness $d_O$ of the light guiding layer 6 and the second cladding layer 7 down to approximately 0.55 $\mu$m. Additional photoresist mask was formed on both sides of the area of length $2L-2r$ and width $W_1$ where the foregoing photoresist mask has already been formed. Then, reactive ion beam etching was performed so that the combined thickness $d_1$ of the light guiding layer 6 and the second cladding layer 7 on both sides of the area of length 2r and width $W_2$ became 0.25 $\mu$m. The photoresist mask was then removed and an SiN$_x$ insulating film 9 was formed by plasma CVD. The SiN$_x$ insulating film 9 on the upper face of the ridge portions 12a and 12b was removed by photolithography or similar technique. The overall thickness of the wafer was then made approximately 100 $\mu$m by polishing the back face of the substrate 1, and a p-sided electrode 10 and n-sided electrode 11 were formed on the upper face of the cap layer 8 and the back face of the substrate 1, respectively. The wafer was then separated into chips of length L by cleavage. Separation was performed in the middle of the area of length 2r and of the area of length $2L-2r$. In the semiconductor laser device produced in this manner, the area with the striped ridge portion 12b of length r and width $W_2$ becomes the mode stabilizing area 14 and the area with the striped ridge portion 12a of length $L-r$ and width $W_1$ becomes the main lasing area 13.

In the main lasing area 13 shown in FIG. 4b, the combined thickness $d_O$ of the light guiding layer 6 and the second cladding layer 7 except for the ridge portion 12a is large, so that the difference in the effective refractive index between the region underneath the ridge portion 12a and the adjacent regions thereto is small. Therefore, the index guiding mechanism becomes weak and the light distribution spread is large. The width $W_1$ of the ridge portion 12a is set smaller than the width of the light distribution, so that as shown in FIG. 4c, the width of the light distribution becomes larger than the width obtained by the gain in the active layer 5. The semiconductor laser device of this example attains self-sustained pulsation as described above.

Figure 4E:
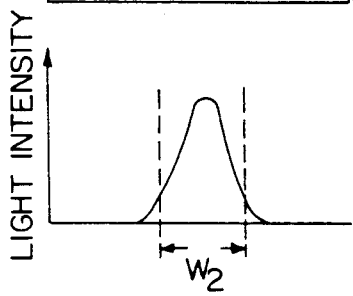

In this example, the combined thickness $d_1$ of the light guiding layer 6 and the second cladding layer 7 except for the ridge portion 12b in the mode stabilizing area 14 is small, so that the difference in the effective refractive index between the region underneath the ridge portion 12b and the adjacent regions thereto is large. As the effective refractive index difference becomes larger, the index guiding mechanism becomes stronger, so that the degree of astigmatism can be made smaller. Furthermore, since the width $W_2$ of the ridge portion 12b is made large and the thickness of the second cladding layer 7 in the ridge portion 12b is set at an appropriately large value, the light distribution in the mode stabilizing area 14 does not become smaller and is approximately equal to the light distribution in the main lasing area 13 as shown in FIG. 4e. Therefore, loss due to a difference in the light modes between the main lasing area 13 and the mode stabilizing area 14 is almost completely eliminated. In this way, the degree of astigmatism can be made small while keeping the oscillation threshold current low. The relationship between the width $W_1$ of the ridge portion 12a and the width $W_2$ of the ridge portion 12b is preferably $1.5W_1 \leq W_2 \leq 4W_1$. If $W_2$ is less than $1.5W_1$, changing the width of the ridge portion has no effect. If $W_2$ is greater than $4W_1$, propagation of a higher-order mode readily occurs and a good beam shape can not be obtained.

In this example, the oscillation threshold current was 10 to 15 mA and the degree of astigmatism was less than 3 $\mu$m.

Example 3

Figure 5A:
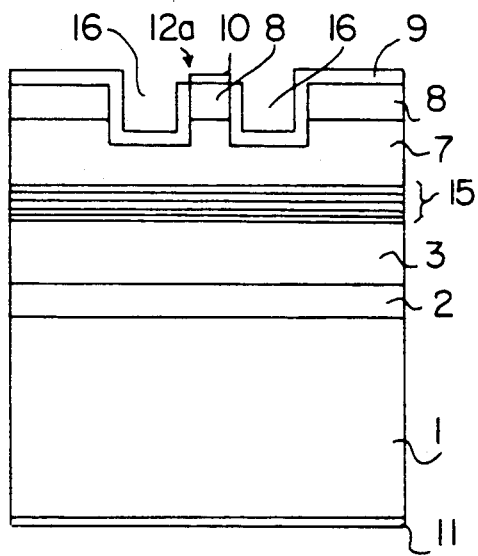
FIGS. 5a and 5b are sectional views showing the sectional configurations the main lasing area and the mode stabilizing areas, respectively, of another semiconductor laser device of this invention.
Figure 5B:
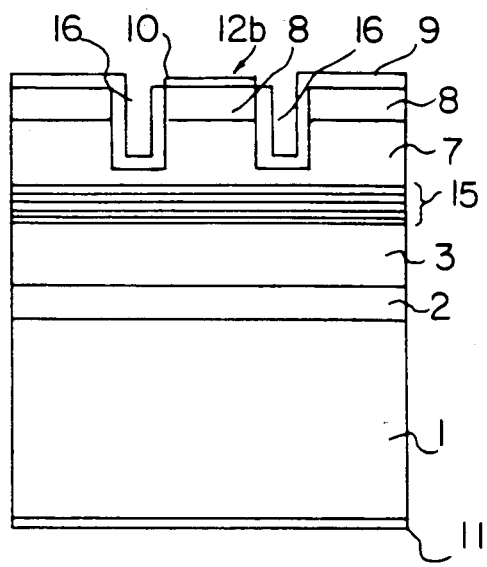

FIGS. 5a and 5b show sectional configurations in the main lasing area and the mode stabilizing areas, respectively, of another semiconductor laser device of this invention. The semiconductor laser device was produced as follows. On the plane of an n-GaAs substrate 1, an n-GaAs buffer layer 2, an n-AlGaAs first cladding layer 3, an AlGaAs multiple quantum-well active layer 15 (well layer: 100 Å thick, 5 layers; barrier layer: 35 Å thick, 4 layers), a p-AlGaAs second cladding layer 7, and a p-GaAs cap layer 8 were successively grown by molecular beam epitaxy. In this example, the second cladding layer 7 with regions of different thicknesses were formed by providing two grooves 16 on either side of the ridge portions 12a and 12b. The regions outside of the grooves 16 were not removed. The width of the two grooves was made small and the grooves were made deep in order to obtain the sectional configuration shown in FIG. 5b in both mode stabilizing areas near the facets. After forming an SiN$_x$ insulating film 9, a p-sided electrode 10 and an n-sided electrode 11 were formed on the upper face of the ridge portions 12a and 12b and the back face of the substrate 1, respectively. By leaving the area outside the grooves 16 as described above, the surface opposite the substrate 1 side can be used as the mounting surface. Mounting in this manner yields better heat radiation characteristics, and the output characteristics and reliability are improved.

Example 4

Figure 6:
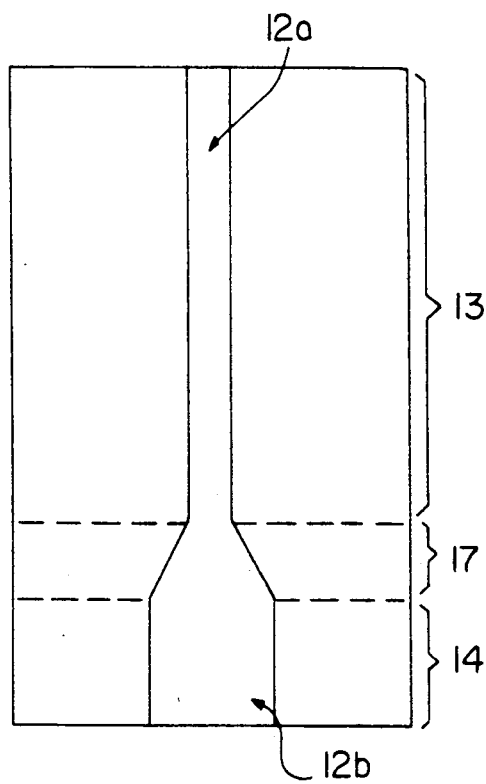
FIG. 6 is a top plan view showing still another semiconductor laser device of this invention.

FIG. 6 is a top plan view showing still another semiconductor laser device of this invention. The sectional configurations in the main lasing area 13 and the mode stabilizing area 14 of this semiconductor laser device are the same as those shown in FIGS. 4b and 4d, respectively. In this example, an intermediate area 17 is provided between these two areas 13 and 14 with a sectional configuration that gradually changes from the sectional configuration of the main lasing area 13 to that of the mode stabilizing area 14. The existence of the intermediate area 17 smooth the transition from the light mode in the main lasing area 13 to that in the mode stabilizing area 14.

Example 5

Figure 1D:
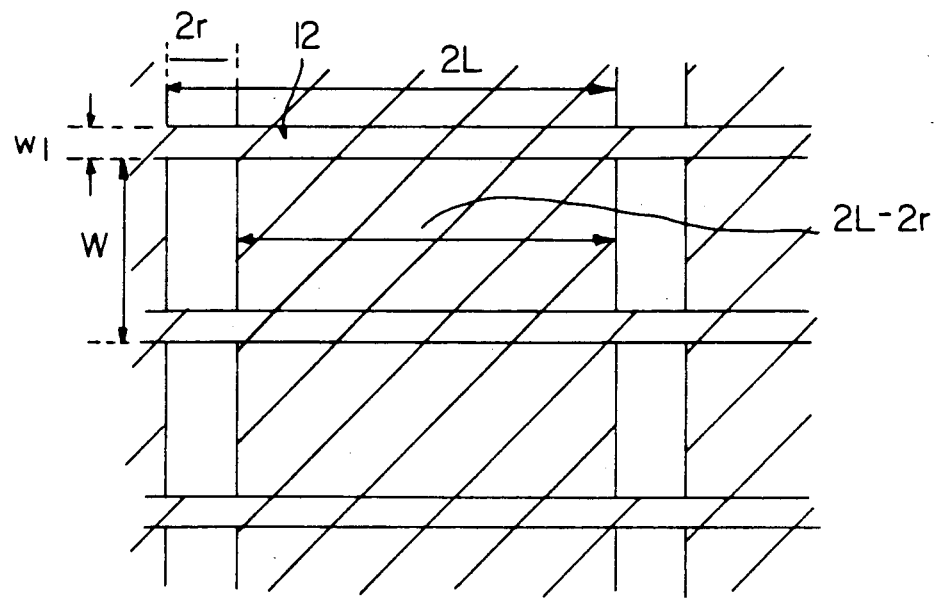
Figure 11:
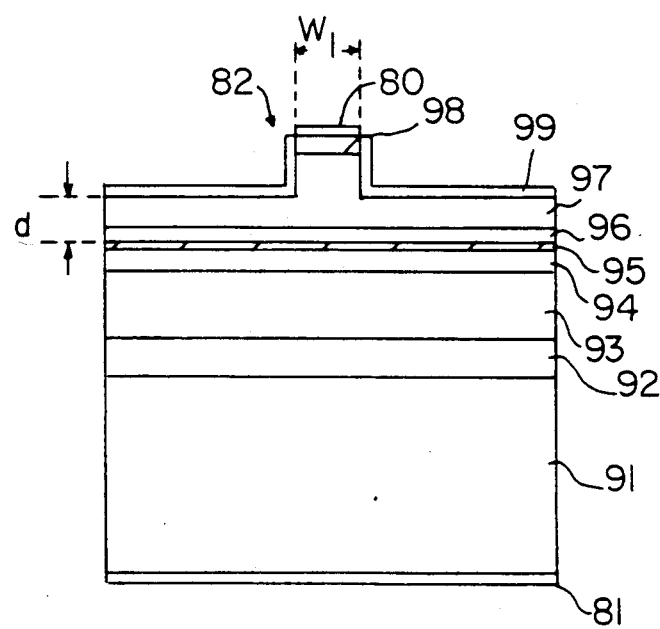
FIG. 11 is a sectional view showing a conventional semiconductor laser device.

In producing the semiconductor laser device of FIG. 1a, the formation of the resist mask must be positioned accurately in the crosshatched area shown in FIG. 1d. The resist mask formed on that part in the mode stabilizing area 14 near the facet, which part becomes the ridge portion 12b, must be positioned with particularly high accuracy. If this positioning is not performed accurately, the shape of the ridge portion 12b will be deformed, the semiconductor laser characteristics will deteriorate, and the production yield will also drop. In order to accurately control the position of the resist mask, the photomask for use in forming the resist mask must be positioned accurately. Since the photomask must be positioned with high accuracy, the process is extremely difficult.

Figure 7A:
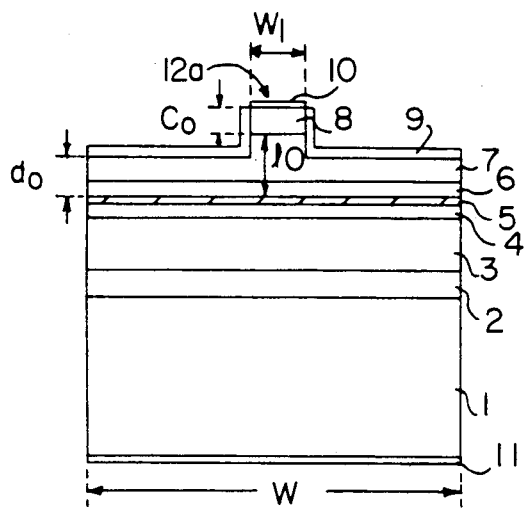
FIGS. 7a and 7b are sectional views showing the sectional configurations in the main lasing area and the mode stabilizing area, respectively, of still another semiconductor laser device of this invention.
Figure 7B:
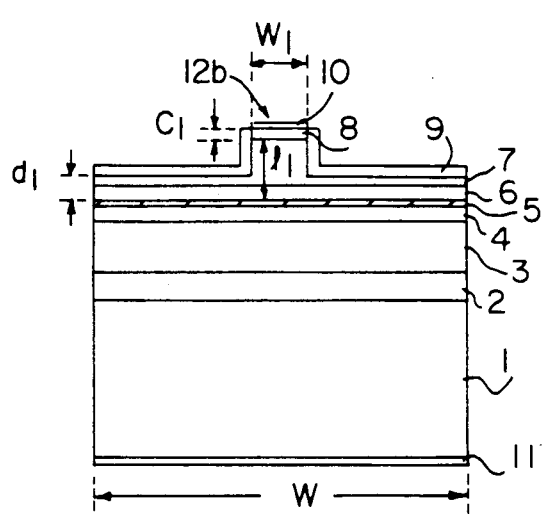

FIGS. 7a and 7b are sectional views showing the sectional configurations in the main lasing area and the mode stabilizing area, respectively, of still another semiconductor laser device of this invention, which solves the above-mentioned problem. The semiconductor laser device was produced as follows. On the plane of an n-GaAs substrate 1, an n-GaAs buffer layer 2 (1 $\mu$m thick), an n-AlGaAs first cladding layer 3 (1.2 $\mu$m thick), an AlGaAs graded-index light guiding layer 4 (0.2 $\mu$m thick), an AlGaAs single quantum-well active layer 5 (70 Å thick), an AlGaAs graded-index light guiding layer 6 (0.2 $\mu$m thick), a p-AlGaAs second cladding layer 7 (1.2 $\mu$m thick), and a p-GaAs cap layer 8 (thickness $c_o = 0.5$ $\mu$m) were successively grown by molecular beam epitaxy. The Al mole fractions in the graded-index light guiding layers 4 and 6 were allowed to decrease gradually toward the active layer 5.

Figure 8A:
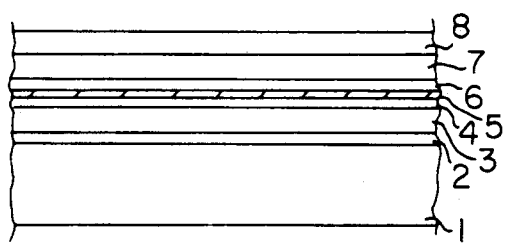
FIGS. 8a to 8d are fragmentary sectional views showing the production of the semiconductor laser device of FIGS. 7a and 7b.
Figure 8B:
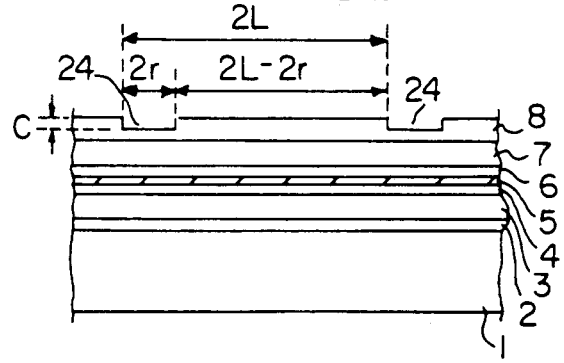

Next, in order to form ridge portions, the etching step was performed as follows. FIG. 8a shows a sectional configuration after the completion of the above growing step. The depth of the mode stabilizing area near the facet with the sectional configuration shown in FIG. 7b is r (20 $\mu$m) and the cavity length of the semiconductor laser device is L (250 $\mu$m). First, resist mask strips of width $2L-2r$ were formed on the entire surface of the cap layer 8 with pitch 2L. Next, the cap layer 8 was etched by a reactive ion beam etching technique to form striped grooves 24 of width 2r (40 $\mu$m) and depth c (0.3 $\mu$m). FIG. 8b shows a sectional configuration after the formation of the striped grooves 24. Because the thickness of the cap layer 8 was 0.5 $\mu$m, the striped grooves 24 were formed only in the cap layer 8. After the resist mask strips were removed, new resist mask strips of width $W_1$ (2 $\mu$m) were formed at right angles to the striped grooves 24 with pitch W (300 $\mu$m). The width $W_1$ of these resist mask strips corresponds to the widths of the ridge portions 12a and 12b to be formed later. The pitch W is the width of the semiconductor laser devices being produced. The resist mask indicated by crosshatching in FIG. 1d, which was used in the production of the semiconductor laser device of FIG. 1a, must be formed with accurate positioning. In contrast to this, the semiconductor laser device of this example does not require such accurate positioning of the resist mask.

Figure 8C:
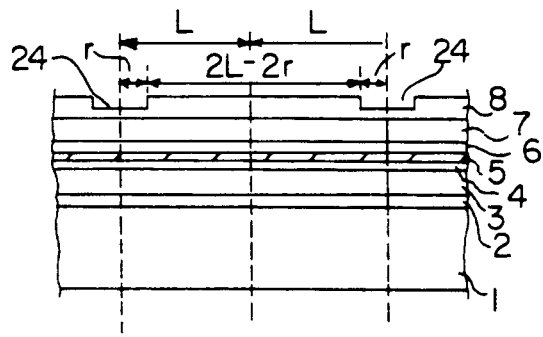
Figure 8D:
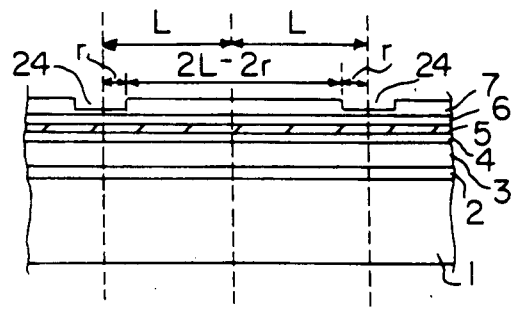

Next, etching was performed down to the depth reaching the second cladding layer 7 by a reactive ion beam etching technique. The ridge portions 12a and 12b were formed by this etching. FIGS. 8c and 8d show sectional configurations in the direction of the ridge strip for the area where the ridge portions 12a and 12b were formed and the area on either side of the ridge portions 12a and 12b, respectively. After the resist mask was removed, an $SiN_x$ insulating film 9 was formed by plasma CVD. The $SiN_x$ insulating film 9 on the upper face of the ridge portions 12a and 12b was removed by photolithography or another technique. The back face of the substrate 1 underwent polishing until the overall thickness of the wafer was made approximately 100 $\mu$m. Then, a p-sided electrode 10 and an n-sided electrode 11 were formed on the upper face of the ridge portions 12a and 12b and the back face of the substrate 1, respectively. The wafer was then separated into chips of length L by cleavage. Separation, as indicated by the dashed lines in FIGS. 8c and 8d, was performed in the middle of the area of the grooves 24 and of the area of length $2L-2r$. In the semiconductor device produced in this manner, the area of length r becomes the mode stabilizing area near the facet and the area of length $L-r$ becomes the main lasing area.

In the above manufacturing process, the mode stabilizing area was formed and etching was then performed to form the ridge portions 12a and 12b. However, this order can be reversed by forming the mode stabilizing area after etching is performed to form the ridge portions 12a and 12b. The following will describe such a reversed manufacturing process. After the same steps as above were used to form the multi-layered crystal structure shown in FIG. 8a, resist mask strips of width $W_1$ (2 $\mu$m) were formed on the cap layer 8 with pitch W (300 $\mu$m). The width $W_1$ corresponds to that of the ridge portions 12a and 12b to be formed later. W is the width of the semiconductor laser device being produced. Then, etching was performed down to the depth reaching the second cladding layer 7 by a reactive ion beam etching technique, thus forming the striped ridge portions 12a and 12b. After the resist mask strips were removed, new resist mask strips with pitch 2L were formed on the striped areas of width $2L-2r$ which intersected the ridge portions 12a and 12b at right angles. The area where resist mask strip was not formed later became the mode stabilizing area. The top layer of the ridge portion 12b in this area became the cap layer 8, and the top layer in the area other than the ridge portion 12b became the second cladding layer 7. Then, etching was performed by a reactive ion beam etching technique. At this time, the cap layer 8 in the ridge portion 12b was etched, whereas in the area other than the ridge portion 12b, the second cladding layer 7 was etched. After the resist mask strips were removed, the semiconductor laser device as shown in FIGS. 7a and 7b was obtained by the same steps as described above.

As described above, the mode stabilizing area near the facet on both sides of the ridge portions 12a and 12b was etched twice, so that the relationship between the combined thickness $d_1$ of the light guiding layer 6 and the second cladding layer 7 in the mode stabilizing area and the combined thickness $d_O$ of the light guiding layer 6 and the second cladding layer 7 in the main lasing area became $d_O > d_1$. In this example, the thickness $d_O$ was 0.55 μm and the thickness $d_1$ was 0.25 μm. The ridge portion 12a in the main lasing area was not etched at all, so that the thickness of the cap layer 8 in this area remains $c_O$ (0.5 μm). The thickness $c_1$ of the cap layer in the mode stabilizing area is the difference between the thickness $c_O$ of the initial cap layer 8 and the depth c of the groove 24 (i.e., $c_1 = c_O - c$). Since $c_O$ was 0.5 μm and c was 0.3 μm, $c_1$ was 0.2 μm. Furthermore, since the second cladding layer 7 inside the ridge portions 12a and 12b was not etched, the thickness $l_1$ of the second cladding layer 7 in the mode stabilizing area and the thickness $l_0$ second cladding layer 7 in the main lasing area were equal to each other.

In the main lasing area of the semiconductor laser device of this example, the combined thickness $d_O$ of the light guiding layer 6 and the second cladding layer 7 except for the ridge portion 12a was set at a large value of 0.55 μm, so that the difference in the effective refractive index between the region underneath the ridge portion 12a and the adjacent regions thereto is small. Therefore, the index guiding mechanism is weak and the light distribution spread is wide. The width $W_1$ of the ridge portion 12a was set smaller than the width of the light distribution, so that the width of the light distribution is greater than the width obtained by the gain in the active layer 5. Thus, self-sustained pulsation occurs in this area.

In the mode stabilizing area near the facet, the combined thickness $d_1$ of the light guiding layer 6 and the second cladding layer 7 except for the ridge portion 12b is small, so that the difference in the effective refractive index between the region underneath the ridge portion 12b and the adjacent regions thereto is large. When the effective refractive index difference becomes large, the index guiding mechanism becomes strong, so that the degree of astigmatism can be made small.

The active layer 5 in this semiconductor laser device has a quantum well structure, so that the oscillation threshold current can be reduced.

The degree of astigmatism in the semiconductor laser device of this example was less than 10 μm and the oscillation threshold current was 15 to 20 mA.

Moreover, as described above, the semiconductor laser device of this example can be produced by the etching of the mode stabilizing area separately from the etching performed to form the ridge portions 12a and 12b. Therefore, the difficult positioning of the photomask for use in forming the resist mask as required by the semiconductor laser device in FIG. 1a can be avoided.

Example 6

Figure 9A:
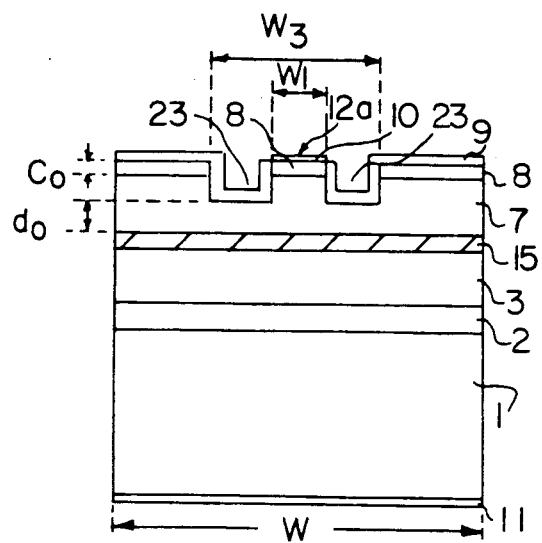
FIGS. 9a and 9b are sectional views showing the sectional configurations the main lasing area and the mode stabilizing areas, respectively, of another semiconductor laser device of this invention.
Figure 9B:
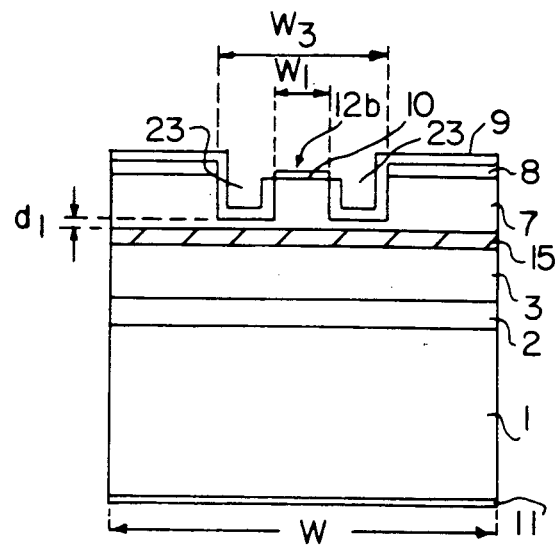
Figure 10:
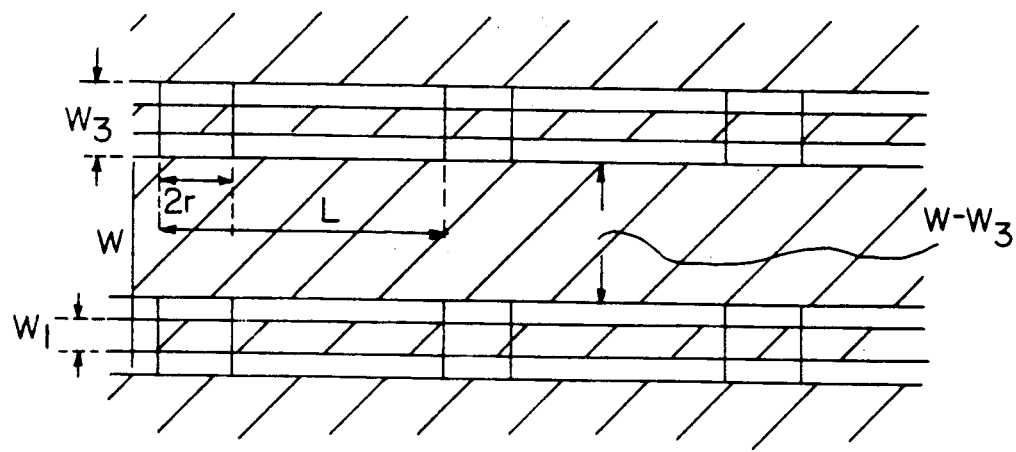
FIG. 10 is a top plan view showing the area where the resist mask is formed in the production of the semiconductor laser device of FIGS. 9a and 9b.

FIGS. 9a and 9b show sectional configurations in the main lasing area and the mode stabilizing area, respectively, of still another semiconductor laser device of this invention. In this example, two striped grooves 23 were formed on either side of the ridge portions 12a and 12b, and the second cladding layer 7 with regions of different thicknesses were formed by changing the depth of the grooves. The regions outside the grooves 23 were not removed. The depth of the two grooves 23 was made large in order to obtain the sectional configuration shown in FIG. 9b in both mode stabilizing areas near the facets. Also, the cap layer 8 in the ridge portions 12b in the mode stabilizing areas was completely removed. This semiconductor laser device was produced as follows. On the plane of an n-GaAs substrate 1, an n-GaAs buffer layer 2, an n-AlGaAs first cladding layer 3, an AlGaAs multiple quantum-well active layer 15 (well layer: 100 Å thick, 5 layers; barrier layer: 35 Å thick, 4 layers), a p-AlGaAs second cladding layer 7 (1.2 μm thick), and a p-GaAs cap layer 8 (thickness $c_O = 0.3$ μm) were successively grown by molecular beam epitaxy. The active layer 15 of this example has a multiple quantum-well structure, but there is no light guiding layer. The grooves 23 and the ridge portions 12a and 12b were formed as follows. The depth of the mode stabilizing areas near the facets with the sectional configuration shown in FIG. 9b is r (20 μm), and the cavity length of the semiconductor laser device is L (250 μm). Furthermore, as shown in FIGS. 9a and 9b, the width of the region where the two grooves 23 and 23 and the ridge portions 12a and 12b were formed is $W_3$ (30 μm), and the width of the semiconductor laser device is W (300 μm). FIG. 10 is a top plan view showing the area where the ridge portions 12a and 12b and the grooves 23 of the semiconductor laser device of this example were formed. First, a resist mask was formed on the cap layer 8 in all areas except for the rectangular areas of width $W_3$ and depth 2r arranged in a matrix. The pitch of the rectangular areas in the direction of width is W, and that in the direction of depth is L. Only the GaAs was then selectively etched by a wet etching technique so that the cap layer 8 was removed from the rectangular areas. By using a selective etching technique, it is not necessary to precisely control the etching conditions, thus simplifying control of the manufacturing process. Next, the resist mask was removed, and as indicated by the crosshatching in FIG. 10, a new resist mask was formed by photolithography both in a strip of width $W_1$ (2.5 μm) on each row of the rectangular areas lined up in the direction of depth and in a strip of width $W - W_3$ between the above-mentioned rows of the rectangular areas.

The resist mask on each row of the rectangular areas was formed at a position approximately in the middle of each rectangular side of width $W_3$. The positioning of the photomask for use in forming these two resist mask strips does not require the high accuracy that is required in the production of the semiconductor laser device of FIG. 1a. Then, etching was performed down to the depth reaching the second cladding layer 7 by a reactive ion beam etching technique, thus forming the grooves 23. Since there was no cap layer 8 on any of the rectangular areas, the grooves 23 in these areas were formed so that the thickness $d_1$ of the second cladding layer 7 was 0.25 μm as shown in FIG. 9b. Furthermore, since there was the cap layer 8 in the areas except for the rectangular areas, the grooves 23 in these areas were formed so that the thickness $d_O$ of the second cladding layer 7 was 0.55 μm as shown in FIG. 9a. After the resist mask was removed, an $SiN_x$ insulating film 9 was then formed by plasma CVD over the entire surface. The $SiN_x$ insulating film 9 on the upper face of the ridge portions 12a and 12b was removed by photolithography or another method. Next, a p-sided electrode 10 and an n-sided electrode 11 were formed as shown in FIGS. 9a and 9b. The wafer was then separated in the middle of each rectangular side of depth 2r and in the middle of the area of width $W-W_3$, resulting in semiconductor laser devices.

In the above manufacturing process, the mode stabilizing areas were formed and etching was then performed to form the ridge portions 12a and 12b. However, this order can be reversed by forming the mode stabilizing areas after etching is performed to form the ridge portions 12a and 12b. The following will describe such a reversed manufacturing process. After the same steps as mentioned above were used to form the multi-layered crystal structure, a resist mask was formed in all areas except for the strip areas corresponding to the two grooves to be formed later. The pitch of each group of the two strip areas is W (300 μm). Then, etching was performed by a reactive ion beam etching technique down to the thickness reaching the second cladding layer 7, thus forming the striped ridge portions 12a and 12b. The resist mask was then removed. A new resist mask was formed in all areas except for the rectangular areas of width $W_3$ and depth 2r arranged in a matrix as shown in FIG. 10. The set of rectangular sides which are opposed to each other in the direction of depth correspond to the respective sides of the two grooves 23, which are opposed to the ridge portion 12b. As explained in the above manufacturing process, the photomask for use in forming a resist mask in all areas except for the rectangular areas arranged in a matrix does not require extremely high accuracy. Then, etching was performed by a reactive ion beam etching technique or wet etching technique. In the rectangular areas, etching was performed until all of the cap layer 8 was removed from the ridge portion 12b, and in the grooves 23 until the thickness $d_1$ of the second cladding layer 7 became 0.25 μm. After the resist mask was then removed, the semiconductor laser device shown in FIGS. 9a and 9b was obtained by the same steps as described above.

In the semiconductor laser device of this example, the ridge portions 12a and 12b were formed by providing the grooves 23, whereas the area outside the grooves 23 was not etched. With the use of such a sectional configuration, the surface opposite the substrate 1 side can be used as the mounting surface. Mounting in this manner yields better heat radiation characteristics, and the output characteristics and reliability are improved. The degree of astigmatism in the semiconductor laser device of this example was 2 to 8 μm and the oscillation threshold current was 15 to 20 mA.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a semiconductor substrate and a multi-layered crystal structure disposed on said substrate, said multi-layered crystal structure containing a first cladding layer, a quantum-well active layer for laser oscillation, and a second cladding layer with a striped ridge portion for current injection, said multi-layered crystal structure forming at least one facet, wherein the difference in the effective refractive index between the region underneath said striped ridge portion and the adjacent regions thereto is greater in a first region which is adjacent said facet than in a second region which is at a greater distance from said facet than said first region.

2. A semiconductor laser device according to claim 1, wherein the thickness of said second cladding layer except for said striped ridge portion is smaller in said first region than in said second region.

3. A semiconductor laser device according to claim 2, wherein the width of said striped ridge portion is greater in said first region than in said second region.

4. A semiconductor laser device according to claim 2, further comprising a cap layer formed on said striped ridge portion, wherein the thickness of said cap layer is smaller in said first region than in said second region, and wherein the distance between the active layer and the cap layer is constant over the entire area in the cavity direction.

* * * * *